(12) United States Patent
Straznicky et al.

(10) Patent No.: US 7,515,418 B2
(45) Date of Patent: Apr. 7, 2009

(54) ADJUSTABLE HEIGHT LIQUID COOLER IN LIQUID FLOW THROUGH PLATE

(75) Inventors: Ivan Straznicky, Carleton Place (CA); Richard Jude Power-Fardy, Ottawa (CA)

(73) Assignee: Curtiss-Wright Controls, Inc., Charlotte, NC (US)

( * ) Notice: Subject to any disclaimer, the term of this patent is extended or adjusted under 35 U.S.C. 154(b) by 260 days.

(21) Appl. No.: 11/527,794

(22) Filed: Sep. 26, 2006

(65) Prior Publication Data
US 2007/0070605 A1 Mar. 29, 2007

Related U.S. Application Data

(60) Provisional application No. 60/720,539, filed on Sep. 26, 2005.

(51) Int. Cl.
*H05K 7/20* (2006.01)
*F28D 15/00* (2006.01)

(52) U.S. Cl. .................. 361/702; 361/699; 361/719

(58) Field of Classification Search .............. 361/719, 361/699, 702
See application file for complete search history.

(56) References Cited

U.S. PATENT DOCUMENTS

| | | | |
|---|---|---|---|
| 3,481,393 A | 12/1969 | Chu | |
| 4,072,188 A | 2/1978 | Wilson et al. | |
| 4,193,445 A * | 3/1980 | Chu et al. | 165/79 |
| 4,330,812 A | 5/1982 | Token | |
| 4,558,395 A | 12/1985 | Yamada et al. | |
| 4,649,990 A * | 3/1987 | Kurihara et al. | 165/80.4 |
| 4,686,606 A | 8/1987 | Yamada et al. | |
| 4,748,495 A * | 5/1988 | Kucharek | 257/713 |
| 4,759,403 A | 7/1988 | Flint et al. | |
| 4,777,561 A | 10/1988 | Murphy et al. | |
| 4,791,983 A | 12/1988 | Nicol et al. | |
| 5,023,695 A * | 6/1991 | Umezawa et al. | 257/714 |
| 5,036,384 A | 7/1991 | Umezawa | |
| 5,132,873 A | 7/1992 | Nelson et al. | |
| 5,144,531 A | 9/1992 | Go et al. | |
| 5,420,753 A * | 5/1995 | Akamatsu et al. | 361/719 |
| 5,465,192 A | 11/1995 | Yoshikawa | |
| 5,485,671 A | 1/1996 | Larson et al. | |
| 5,549,155 A | 8/1996 | Meyer, IV et al. | |

(Continued)

FOREIGN PATENT DOCUMENTS

EP 1508916 A1 2/2005

*Primary Examiner*—Anatoly Vortman
(74) *Attorney, Agent, or Firm*—Pearne & Gordon LLP

(57) ABSTRACT

An arrangement having a cooling function is provided, comprising a circuit board, a plurality of heat generating devices attached to the circuit board, a cooling device thermally connected to one of the plurality of electronic devices, and a coolant plate. An example of the arrangement can include a source of pressurized coolant fluid connected to the coolant plate and adapted to cause the coolant fluid to be transferred between the coolant plate and the cooling device. In addition or alternatively, the arrangement can include a plurality of flexible conduits and an adjustment device adapted to selectively adjust he height of the cooling device. In addition or alternatively, a cooling apparatus within a cooling arrangement can comprise a cooling device, a coolant plate, and a coolant pathway including a first passage formed in the coolant plate and a second passage formed in the cooling device.

20 Claims, 7 Drawing Sheets

U.S. PATENT DOCUMENTS

| | | |
|---|---|---|
| 5,920,457 A | 7/1999 | Lamb et al. |
| 5,949,648 A | 9/1999 | Liao |
| 6,008,987 A | 12/1999 | Gale |
| 6,065,208 A | 5/2000 | Lamb et al. |
| 6,111,749 A | 8/2000 | Lamb et al. |
| 6,116,331 A | 9/2000 | Tutaniwskyj et al. |
| 6,166,908 A | 12/2000 | Samaras et al. |
| 6,179,047 B1 | 1/2001 | Tustaniwskyj et al. |
| 6,388,317 B1 | 5/2002 | Reese |
| 6,657,121 B2 | 12/2003 | Garner |
| 6,664,627 B2 | 12/2003 | Cheon |
| 6,668,570 B2 | 12/2003 | Wall et al. |
| 6,778,393 B2 | 8/2004 | Messina et al. |
| 6,839,235 B2 | 1/2005 | St. Louis et al. |
| 6,981,543 B2 | 1/2006 | Chesser et al. |
| 7,187,549 B2 | 3/2007 | Teneketges et al. |
| 7,187,553 B2 | 3/2007 | Schmidberger |
| 7,280,363 B2 | 10/2007 | Reyzin et al. |
| 2004/0163797 A1 | 8/2004 | Cosley et al. |

* cited by examiner

ADJUSTABLE HEIGHT LIQUID COOLER IN LIQUID FLOW THROUGH PLATE

RELATED APPLICATIONS

This application claims the benefit of U.S. Provisional Application No. 60/720,539, filed on Sep. 26, 2005, the entire disclosure of which is hereby incorporated herein by reference.

FIELD OF THE INVENTION

The present invention relates generally to an apparatus for cooling electronic devices, and more particularly to an apparatus using fluid flow for cooling electronic devices.

BACKGROUND OF THE INVENTION

Electronic devices, such as electronic circuits, having high-power or densely packed components can often result in the production of heat that cannot be easily dissipated. Excess heat will create temperatures above a normal or acceptable operating temperature range with the potential for improper operation, device failure, or system failure. The individual components on an electronic circuit produce heat that must be conveyed away from the components and from the circuit card so that the temperatures of the components do not exceed their maximum operating temperatures. As the sizes of the components become smaller and the spacing becomes tighter, the power dissipation per area increases and the heat removal problem becomes greater.

There are various methods known in the art for cooling electronic devices and electronic circuits. For example, it is known in high-temperature environments to incorporate heat dissipation channels in the circuit card to conduct heat away from individual components along the plane of the card to the heat dissipation strips along the edge of the circuit card.

It is also known to use a monolithic liquid flow through plate having an internal fluid flow to cool an electronic device. The monolithic liquid flow through plate may be shaped to come into contact, either directly or indirectly through an intermediate medium, with one or more components on the electronic device to conduct heat away from the components to the plate. Such monolithic liquid flow through plates, however, only provide a general cooling solution for electronic devices having moderate heat loads, such as, for example, 40-50 Watts. Thus, they are not adapted to provide extensive cooling for high heat loads. Accordingly, there is a need for an improved cooling apparatus for electronic devices.

BRIEF SUMMARY OF THE INVENTION

The following presents a simplified summary of the invention in order to provide a basic understanding of some aspects of the invention. This summary is not an extensive overview of the invention. It is intended to identify neither key nor critical elements of the invention nor delineate the scope of the invention. Its sole purpose is to present some concepts of the invention in a simplified form as a prelude to the more detailed description that is presented later.

In accordance with an aspect of the present invention, an arrangement having a cooling function is provided comprising a circuit board, a plurality of heat generating electronic devices attached to the circuit board, and a cooling device thermally connected to one of the plurality of electronic devices. A coolant plate is in fluid communication with the cooling device and a source of pressurized coolant fluid is connected to the coolant plate and adapted to cause the coolant fluid to be transferred between the coolant plate and the cooling device. The cooling device is adapted to absorb heat from the one of the plurality of electronic devices and transfer that heat to the coolant fluid, and the coolant plate is adapted to absorb heat from the remainder of the plurality of electronic devices and transfer that heat to the coolant fluid.

In accordance with another aspect of the present invention, an arrangement is provided having a cooling function, comprising a circuit board, a plurality of heat generating electronic devices attached to the circuit board, and a cooling device thermally connected-to-one-of-the-plurality of electronic devices. A coolant plate is also provided. A plurality of flexible conduits are attached to the cooling device and the coolant plate, and are adapted to permit a coolant fluid to be transferred between the cooling device and the coolant plate. An adjustment device is adapted to selectively adjust the height of the cooling device relative to the one of the plurality of electronic devices.

In accordance with another aspect of the present invention, a cooling apparatus is provided within a cooling arrangement having a circuit board, a plurality of heat generating electronic devices attached to the circuit board, and a source of pressurized coolant. The cooling apparatus comprises a cooling device thermally connected to one of the plurality of electronic devices and a coolant plate. A cooling pathway includes a first passage formed in the coolant plate and a second passage formed in the cooling device, and the first passage is in fluid communication with the second passage. A portion of the coolant fluid is transferred between the coolant plate and the cooling device to cause heat absorbed by the cooling device from the one of the plurality of electronic devices to be transferred therefrom. A portion of the coolant fluid is transferred within the first passage to cause heat absorbed by the coolant plate from the remainder of the plurality of electronic devices to be transferred therefrom.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DESCRIPTION OF EXAMPLE EMBODIMENTS

Figure 1:
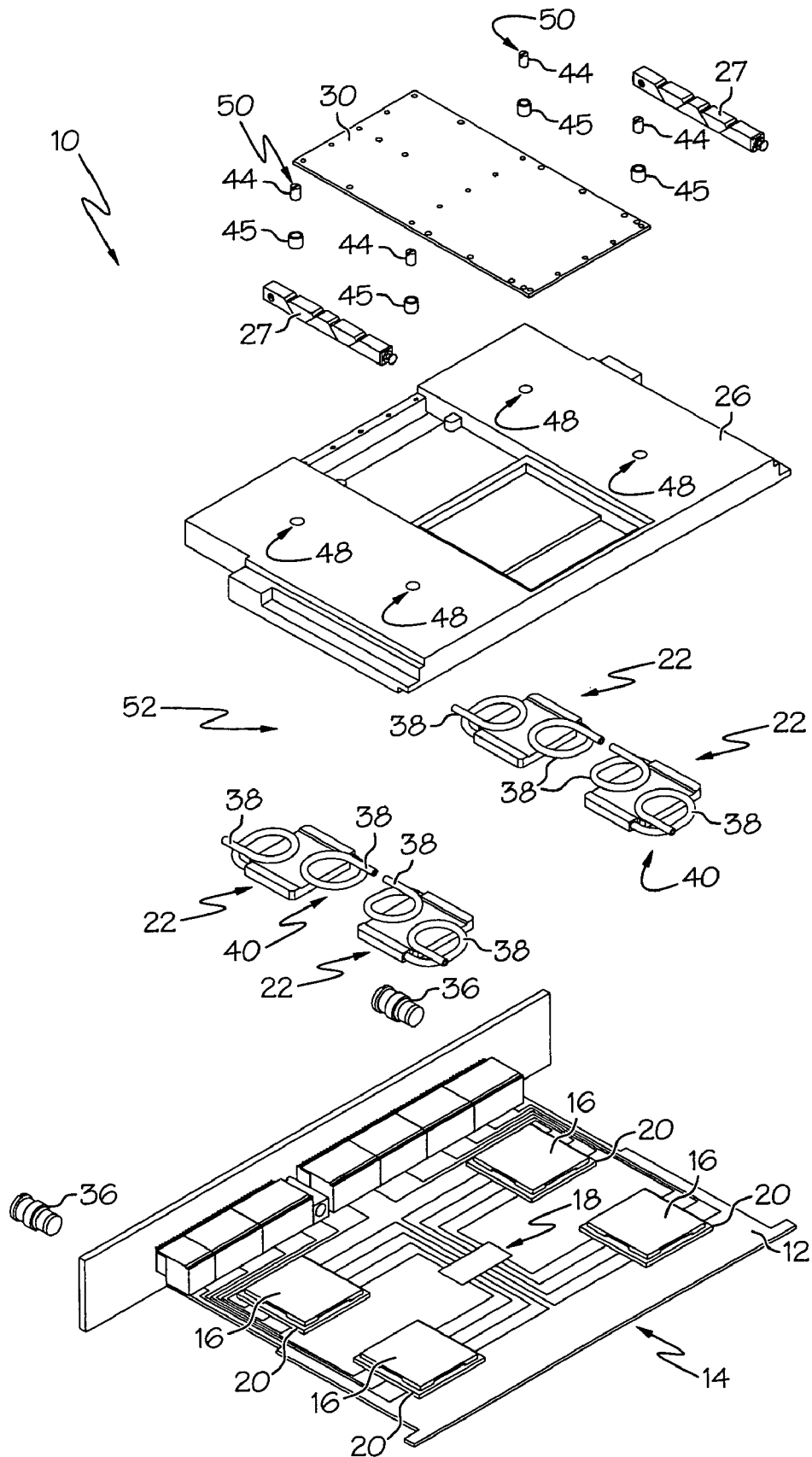
FIG. 1 is a perspective, exploded view of an example cooling apparatus according to an aspect of the present invention.
Figure 2:
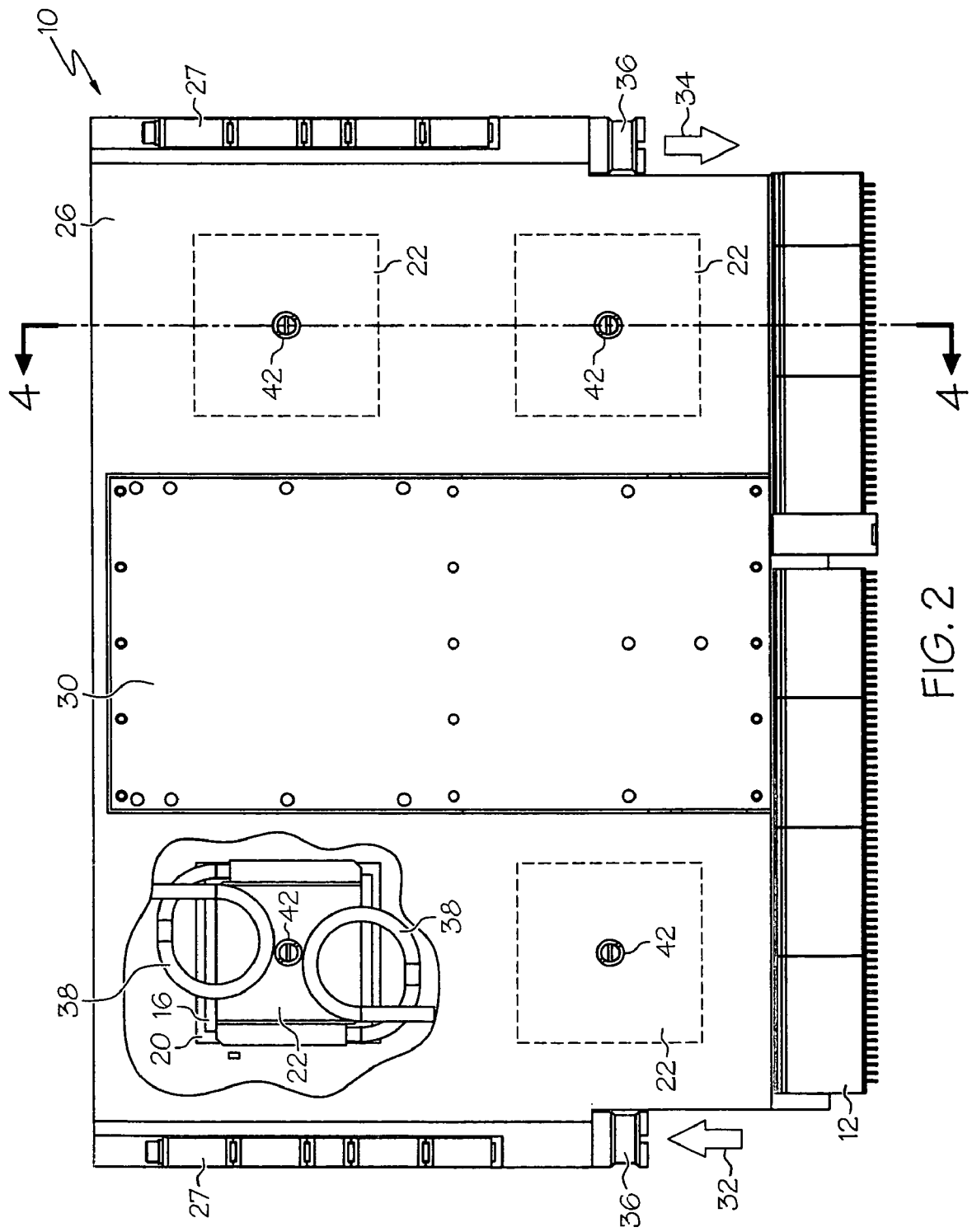
FIG. 2 is a top view of the cooling apparatus of FIG. 1.

An example embodiment of a device that incorporates the present invention is shown in the drawings. It is to be appreciated that the shown example is not intended to be a limitation on the present invention. Specifically, the present invention can be utilized in other embodiments and even other types of devices.

An example arrangement 10 having a cooling function in accordance with the present invention is schematically shown in FIG. 1. The arrangement 10 includes a circuit board 12 having a plurality of heat generating electronic devices 14 attached thereto. The electronic devices 14 are electrically connected to the circuit board 12. The electronic devices 14 can include either or both of high heat load devices 16 and low heat load devices 18. In the shown example, four high heat load devices 16 are shown as large integrated circuits (IC), and a variety of other supplementary electronic components are shown as low heat load devices 18. For example, as shown, the IC's 16 may include a silicon chip mounted on a substrate 20, such as a dielectric substrate. It is to be appreciated that any number of high and low heat load devices 16, 18 can be arranged in any manner on the circuit board 12, and may be connected in any manner thereto.

A cooling device 22 is thermally connected to one of the plurality of electronic devices 14. In the shown example, each cooling device 22 is thermally connected to a separate one of the plurality of IC's 16. As shown and as will be described herein, four cooling devices 22 are each thermally connected to a separate IC 16, but it is to be appreciated that the present invention is to be broadly interpreted to include at least one cooling device 22 connected to at least one of the plurality of electronic devices 14. It is also to be appreciated that a single cooling device 22 could be thermally connected to more than one IC 16. The cooling device 22 can include a variety of materials, such as aluminum or copper, or alloys thereof, and/or can also include composite materials, such as aluminum-graphite.

The cooling devices 22 can include any components adapted to permit a coolant fluid to flow therethrough to absorb heat. For example, as shown schematically in FIGS. 3 and 6A-6C, the cooling devices 22 can include known minichannel cooling devices (e.g., approximately 0.5 to 1 millimeter diameter channels) or microchannel cooling devices (e.g., approximately 50 to 500 micrometer diameter channels), depending upon the specific application and the amount of heat to be absorbed. In the shown example of FIGS. 6A-6C, the cooling device 22 includes microchannels 21. The different size cooling channels (not shown) allow the cooling devices 22 to each be tailored to different electronic devices having different heat loads (i.e., minichannels for low to moderate heat loads, microchannels for moderate to high heat loads). It is to be appreciated that cooling devices 22 having any size or configuration of internal coolant channels can be used.

Figure 4:
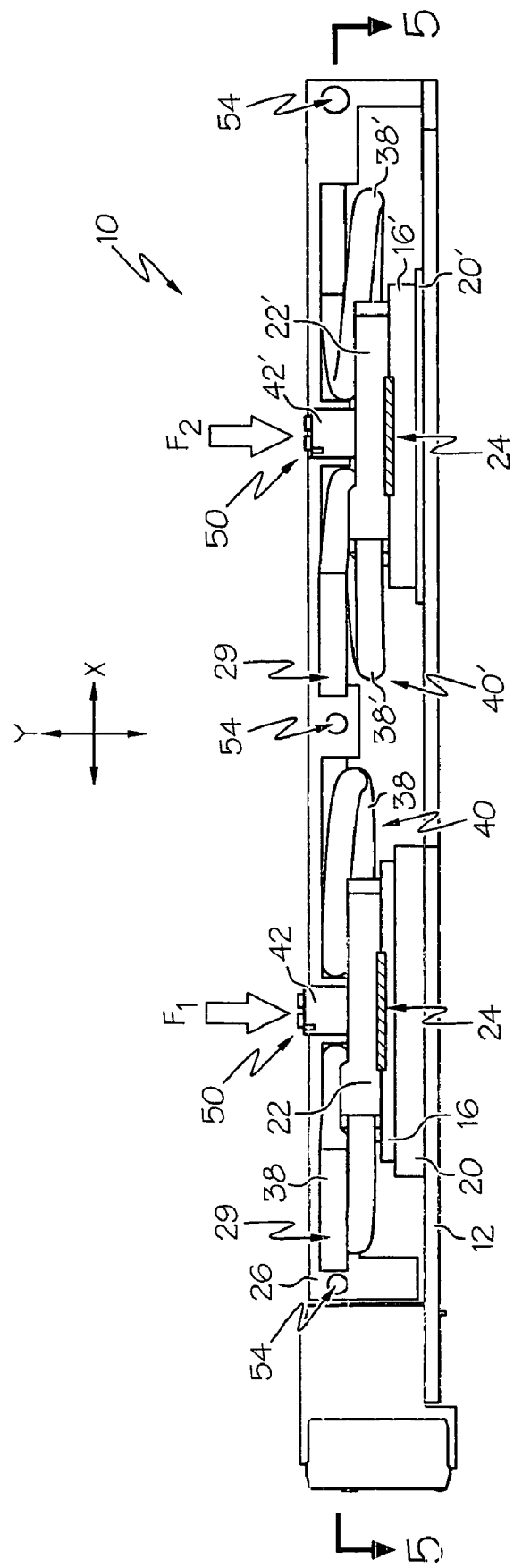
FIG. 4 is a sectional view along line 4-4 of FIG. 2 of an example adjustment device of the cooling apparatus.

Each cooling device 22 may be directly connected to each IC 16 or, alternatively, may be indirectly connected to each IC through a thermally conductive medium. As shown in FIG. 4, a thermal interface material 24 may be disposed between the IC 16 and the cooling device 22 to enhance the thermal connection therebetween. For example, the thermal interface material 24 can include thermal grease or the like. Alternatively, the thermal interface material 24 can include a temperature-sensitive phase change material that is capable, for example, of changing between solid and liquid phases. Additionally, the thermal interface material 24 can include a thermal adhesive portion adapted to help retain the cooling device 22 on the IC 16.

The arrangement 10 can further include a coolant plate 26. The coolant plate 26 can be of the type known as a liquid flow through plate. As such, the coolant plate 26 can be adapted to have a coolant flowing therethrough, whereby heat absorbed by the coolant plate 26 can, in turn, be absorbed by the coolant fluid. Thus, the coolant plate 26 includes at least one passage 28 formed therein to provide a path for the coolant to flow. In the shown example of FIG. 5, the coolant plate 26 includes at least four passages 28, though it is to be appreciated that the coolant plate 26 can include various numbers of passages 28 arranged in various manners (e.g., manifolds cold be created to supply equivalent liquid pressures to multiple areas of the coolant plate).

The coolant plate 26 can also include additional structure adapted to facilitate the coolant flow. For example, the coolant plate 26 can include an inlet port 32 and an outlet port 34 for the coolant. Additionally, the coolant plate 26 can include quick-disconnect fittings 36 attached to both the inlet and outlet ports 32, 34 adapted to provide a quick and easy way to connect the coolant plate 26 to a source of coolant, such as a manifold pump or the like (not shown). The coolant plate 26 can include a variety of materials, such as aluminum or copper, or alloys thereof, and/or can also include composite materials, such as aluminum-graphite.

Various coolant fluids may be used to cool the coolant plate 26 and/or the cooling devices 22. For example, the coolant fluid can include water. In addition or alternatively, the coolant fluid can include any chemical mixture having a sufficient ability to absorb heat from the coolant plate 26 and/or cooling devices 22. Further still, the coolant fluid can include a multiple phase fluid that is adapted to change states at various temperatures. For example, the multiple phase fluid could change, partially or completely, from a liquid to a gas as it absorbs heat from the coolant plate 26.

It is to be appreciated that the coolant plate 26 can further serve as a protective casing for the circuit board 12 and electronic devices 14. When the exploded components shown in FIG. 1 are assembled into one arrangement 10, the coolant plate 26 can be disposed in a covering and protective relationship to the circuit board 12, electronic devices 14, and cooling devices 22. Various known methods may be used to assemble the components into one arrangement 10. Further, the coolant plate 26 can include structure adapted to mount the assembled arrangement 10 to other devices, such as, for example, a rack (not shown). For example, the coolant plate 26 can include wedge blocks 27 adapted to secure the assembled arrangement 10 toga rack (not shown).

Further still, the arrangement 10 can include additional components adapted to supply the coolant to the coolant plate 26. For example, the arrangement 10 can include a source of pressurized coolant fluid, such as a pump (not shown). The pump (not shown) can be exterior to the coolant plate 26, or it can even be integrated into one of the passages 28. Further still, the arrangement 10 can include supplementary components (none shown) for handling of the coolant flow, such as a filter, a reservoir, a control system for controlling the coolant flow and/or sensors connected to the control system (e.g., flow, pressure or temperature sensors). Even further still, the arrangement 10 can include a heat exchanger (e.g., a liquid to air heat exchanger, or the like, not shown) in communication with the inlet and outlet ports 32, 34 of the coolant plate 26. For example, the heat exchanger (not shown) could be adapted to remove the heat from the coolant fluid, or in the case of two phase cooling, condense the coolant vapor into liquid, before the coolant fluid was returned to the coolant plate 26.

As shown, the coolant plate 26 is in fluid communication with each of the cooling devices 22. Any known method may be used to enable fluid communication between the coolant plate 26 and the cooling devices 22. For example, a plurality of flexible conduits 38 can be attached to the coolant plate 26 and to the cooling devices 22. In the example shown in FIG. 4, the flexible conduits 38 can be removably attached to the coolant plate 26 through fittings 29, or can be fixedly attached through brazing, soldering, or the like.

Figure 3:
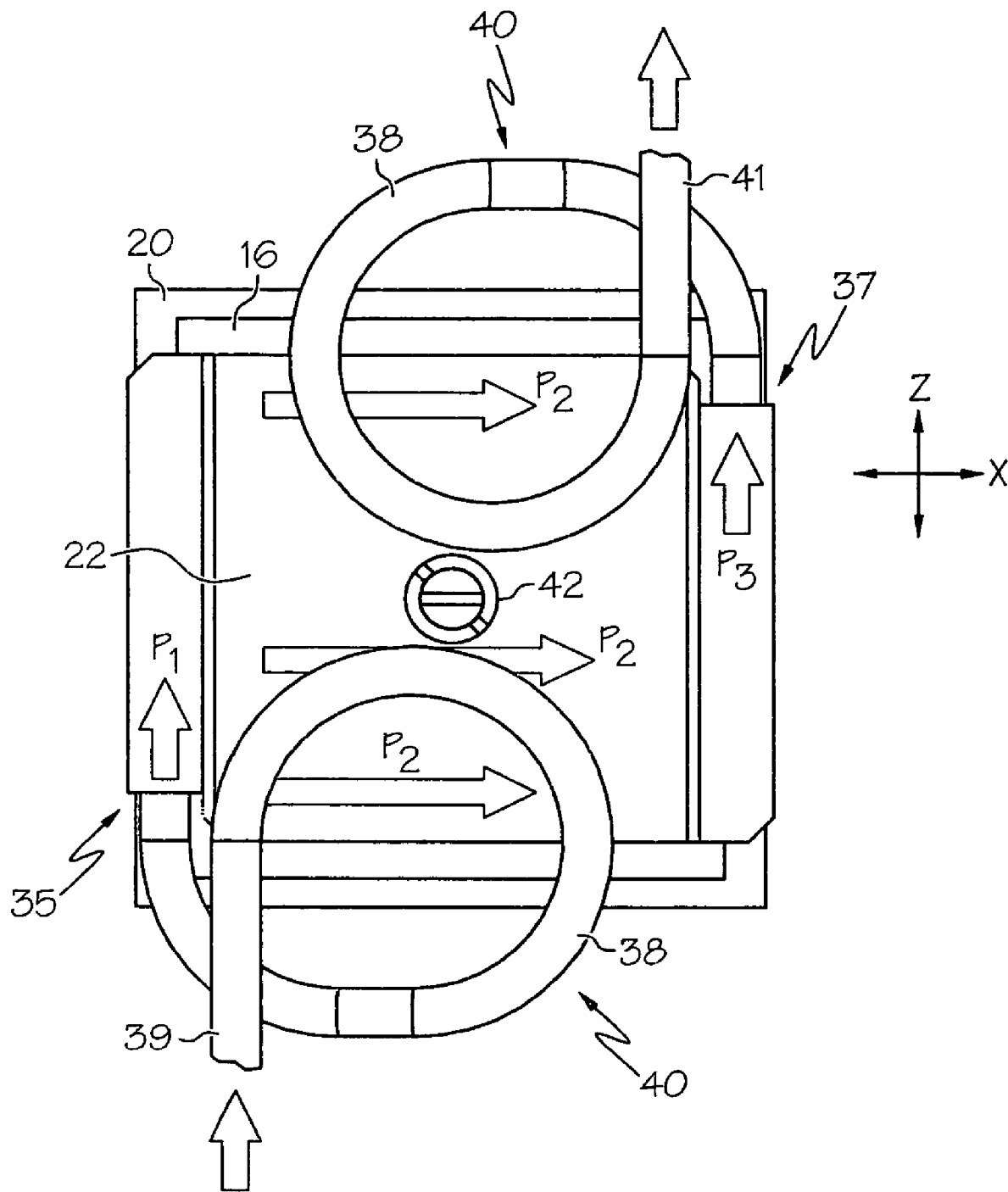
FIG. 3 is a detail view of an example cooling device of the cooling apparatus of FIG.1.

The flexible conduits 38 can be adapted to permit the coolant fluid to be transferred between the coolant plate 26 and the cooling devices 22. As shown in FIG. 3, one flexible conduit can function as an inlet conduit 39 to bring the coolant fluid to the cooling device 22, and one flexible conduit can function as an outlet conduit 41 to move the warmed coolant fluid away from the cooling device 22. The flexible conduits 38 can include any suitable material, such as copper tubing, stainless steel tubing, or polymeric tubing, and can even be formed as part of the coolant plate 26 and/or cooling devices 22. The flexible conduits 38 can be connected to the cooling devices 22 by any known method, such as, for example, fittings, brazing, and/or soldering. It is to be appreciated that when the arrangement 10 includes more than one cooling device 22, each cooling device 22 can be independently in fluid communication with the passage 28 in the coolant plate 26, such that a portion of the coolant fluid is delivered to each cooling device 22 through separate flexible conduits 38 (e.g., a parallel configuration). Alternatively, some, or all, of the cooling devices 22 can be arranged in series such that a portion of the coolant fluid is successively delivered to multiple cooling devices 22.

In accordance with one aspect of the invention, the source of pressurized coolant fluid (e.g., the pump, not shown) can be adapted to cause the coolant fluid to be transferred between the coolant plate 26 and the cooling devices 22 through the flexible conduits 38. The cooling devices 22 are each adapted to absorb heat from at least one of the plurality of electronic devices 14 and to transfer that heat to the coolant fluid. For example, as shown, each cooling device 22 can be adapted to absorb heat from one IC 16, aided by the thermal interface material 24 (if present), and to transfer that heat to the coolant fluid flowing through the cooling device 22. Further, the coolant plate 26 is adapted to absorb heat from the remainder of the plurality of electronic devices 18 and to transfer that heat to the coolant fluid flowing through the coolant plate 24.

Additionally, the coolant plate 26 may include structure (not shown) adapted to provide a thermal connection to the remainder of the electronic devices 18, either directly or indirectly through a thermal interface material (not shown). For example, a gap-filling thermal foam may be located between the coolant plate 26 and one or more of the remainder of the plurality of electronic devices 18. Further still, a plurality of circuit boards can be thermally connected to the coolant plate 26. In the example shown in FIG. 1, a mezzanine circuit board 30 (e.g., a daughter board or the like) is thermally connected to the coolant plate 26 in addition to the main circuit board 12. Thus, the coolant plate 26 can be adapted to absorb heat from each of the plurality of circuit boards 12, 30 and to transfer that heat to the coolant fluid.

Turning now to the example shown in FIG. 4, each IC 16 can be individually mounted to the circuit board 12. During the assembly process, it is common for the various IC's 16 to be mounted at slightly different horizontal and/or vertical displacements relative to each other and to the circuit board 12. In addition or alternatively, the various IC's 16 and/or the substrates 20 can have various thicknesses. For example, as shown in FIG. 4, the lefthand IC 16 and substrate 20 are relatively thicker than the righthand IC 16' and substrate 20'. It is to be appreciated that the proportions of the various elements (e.g., 16, 16', 20, 20') in the shown example have been exaggerated to further illustrate the adjustment aspect of the present invention.

Figure 7A:
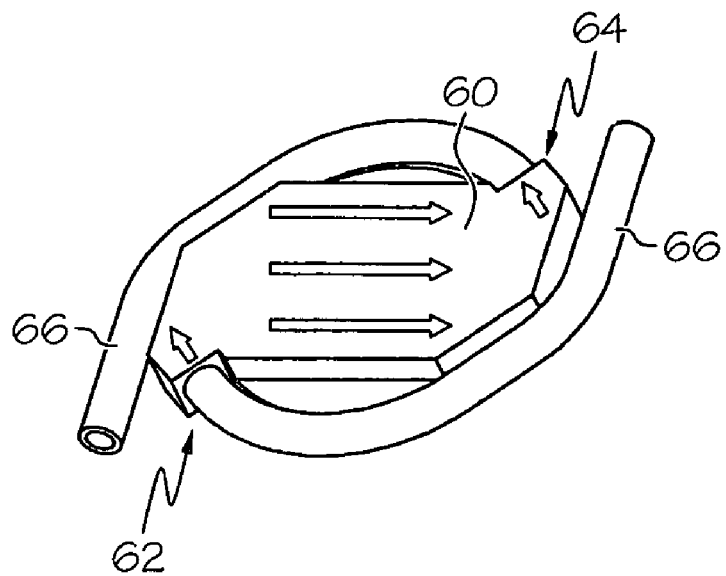
FIG. 7A is a top view of a first example alternative cooling device.
Figure 7B:
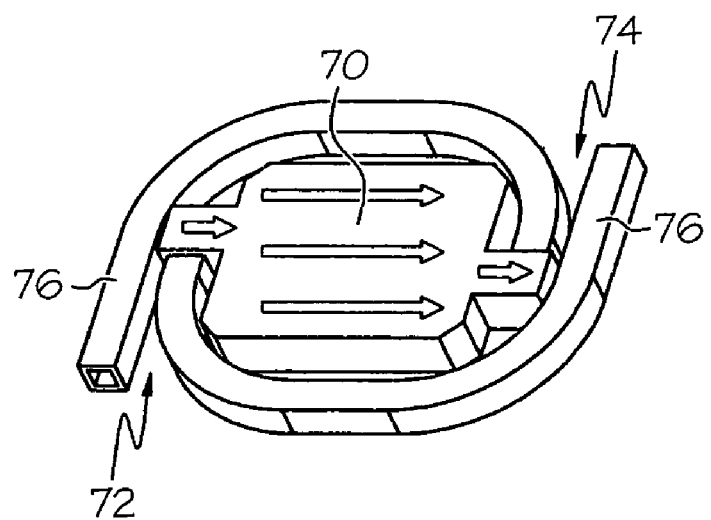
FIG. 7B is a top view of a second example alternative cooling device.

Thus, the flexible conduits 38 are capable of permitting movement of the cooling device 22 along at least one axis (e.g., X, Y, Z) to provide a close thermal connection between a respective cooling device 22 and an IC 16 despite any horizontal and/or vertical mounting variations. As shown in FIGS. 1, 3 and 4, the flexible conduits 38 can include single turn coils having a helical geometry 40. Thus, the helical geometry 40 permits movement of the cooling device 22 along three axes (e.g., X, Y, Z) to allow for any mounting displacement of an IC 16. It is to be appreciated that the flexible conduits 38 can have any geometry that allows movement of the cooling device 22 along at least one axis. For example, the flexible conduits 38 can be arranged as shown in FIGS. 7A and 7B.

To provide a close thermal connection between a respective cooling device 22 and an IC 16, the arrangement 10 can further comprise an adjustment device 42. The adjustment device 42 is adapted to selectively adjust the height of the cooling device 22 relative to the IC 16 that it is thermally connected to. Thus, any gap between the cooling device 22 and the IC 16 can be thereby reduced to any desired distance. As such, the thermal connection between each cooling device 22 and each IC 16 can be individually controlled.

Turning now to the examples shown in FIGS. 1 and 4, the arrangement 10 can include an adjustment device 42 adapted to selectively adjust the height of the cooling device 22. The adjustment device 42 can comprise a threaded fastener 44 having external threads (not shown) adapted to operatively engage corresponding structure of the coolant plate 26. Alternatively, the threaded fastener 44 may indirectly engage the coolant plate 26 through an intermediary component, such as a threaded insert 45. As shown in FIG. 1, the threaded fastener 44 can be disposed within a hole 48 extending through the coolant plate 26. As such, the threaded fastener 44 can directly, or indirectly through an intermediary component such as, for example, a spacer bar (not shown), contact a portion of a cooling device 22 to thereby push the cooling device 22 towards the IC 16.

For example, as shown in FIG. 4, because the lefthand IC 16 and substrate 20 are relatively thicker than the righthand IC 16' and substrate 20', the righthand adjustment device 42' can be adjusted vertically downward relative to the lefthand adjustment device 42 to ensure a thermal connection with the righthand cooling device 22'. Additionally, it is to be appreciated that the helical geometry 40' of the righthand flexible conduits 38' can facilitate such vertical adjustment of the cooling device 22'.

Because the example adjustment device 42 is threaded, it is capable of being selectively adjustable along a vertical direction relative to the coolant plate 26. The threaded fastener 44, which can be, for example, a set screw, can include structure 50 located at one end, such as a slotted, phillips, or hex head, or the like, adapted to permit vertical adjustment of the threaded fastener 44 relative to the coolant plate 26. Thus, because the threaded fastener 44 is selectively adjustable along a vertical direction relative to the coolant plate 24, it is capable of selectively adjusting the vertical height of the cooling device 22 relative to the coolant plate 26, the circuit board 12 and/or the IC 16. It is to be appreciated that the foregoing description of the example adjustment device 42 is not intended to be a limitation on the present invention, and that any adjustment device 42 capable of selectively adjusting the height of the cooling device 22 can be used.

Further, the adjustment device 42 (e.g., threaded fastener 44) can be adapted to selectively adjust a force F applied by the cooling device 22 onto the IC 16 that it is thermally connected to. For example, different thermal interface materials 24, such as those including a phase change material, can require a particular applied pressure for proper operation. As previously stated, because the threaded fastener 44 is capable of selectively adjusting (e.g., via the threaded connection) the vertical height of the cooling device 22 through direct (or indirect) contact, it is capable of applying a selective force (e.g., $F_1$, $F_2$) to the IC 16. For example, once the threaded fastener 44 contacts a portion of the cooling device 22 and pushes it into abutment with the IC 16 (or thermal interface material, if applicable), additional tightening of the threaded fastener 44 will cause the cooler 22 to apply an additional force to the IC 16. Alternatively, when a delicate or fragile IC 16 is used, the adjustment device 42 can ensure that no additional force is applied thereto by a cooler 22 to protect the IC 16 from damage.

Because the adjustment device 42 is adapted to be selectively adjustable relative to any component, the arrangement 10 can be used with a circuit board 12 having a variety of electronic components 14 producing a variety of heat loads. For example, the arrangement 10 can include a plurality of adjustment devices 42 wherein each one is adapted to selectively adjust the height of one of a plurality of cooling devices 22. Thus, the height of each cooling devices 22 can be selectively adjusted relative to the IC 16 that it is thermally connected to. Therefore, each cooling device 22, and any associated thermal interface material 24, can be tailored to the specific heat load of a particular IC 16. For example, one cooling device 22 having relatively high heat absorption properties can be used with an IC 16 generating a relatively high heat load, while a separate cooling device 22 having relatively moderate heat absorption properties can be used with a separate IC 16 generating a relatively moderate heat load. It is to be appreciated that each of the adjustment devices 42 can be adapted to selectively adjust the force applied by each of the cooling devices onto the IC 16 that it is thermally connected to.

As shown in FIG. 4, when the arrangement 10 is assembled into one unit, the internal space between the circuit board 12 and the coolant plate 26 can be relatively small. As such, it may not be convenient or even possible to arrange the flexible conduits 38 in a helical geometry as herein described. To alleviate this problem, various cooling devices 22 and flexible conduits 38 having various geometries may be used with the present invention.

Turning briefly to FIGS. 7A and 7B, example alternate cooling devices 60, 70 are shown that can be used with the present invention. As previously stated, the flexible conduits 66, 76 may be arranged in any geometry that permits movement of the cooling device 60, 70 along at least one axis to allow for mounting displacement of an IC 16. For example, the flexible conduits 66, 76 may wrap around the alternative cooling devices 60, 70. In this configuration, the flexible conduits 66, 76 can have substantially the same height as the cooling device 60, 70 so as to fit within a relatively small internal space between the circuit board 12 and the coolant plate 26. Even so, the excess length of conduit 66, 76 provided can still perform as the helical geometry 40 to permit movement of the cooling device 60, 70 along multiple axes (e.g., X, Y, Z) similar to that previously disclosed herein. Further still, the flexible conduits 66, 76 may have any cross-sectional geometry as required. As shown, the flexible conduits 66 of the first alternate cooling device 60 have a generally circular cross-section, while the flexible conduits 76 of the second alternate cooling device 70 have a generally square cross-section.

Figure 6A:
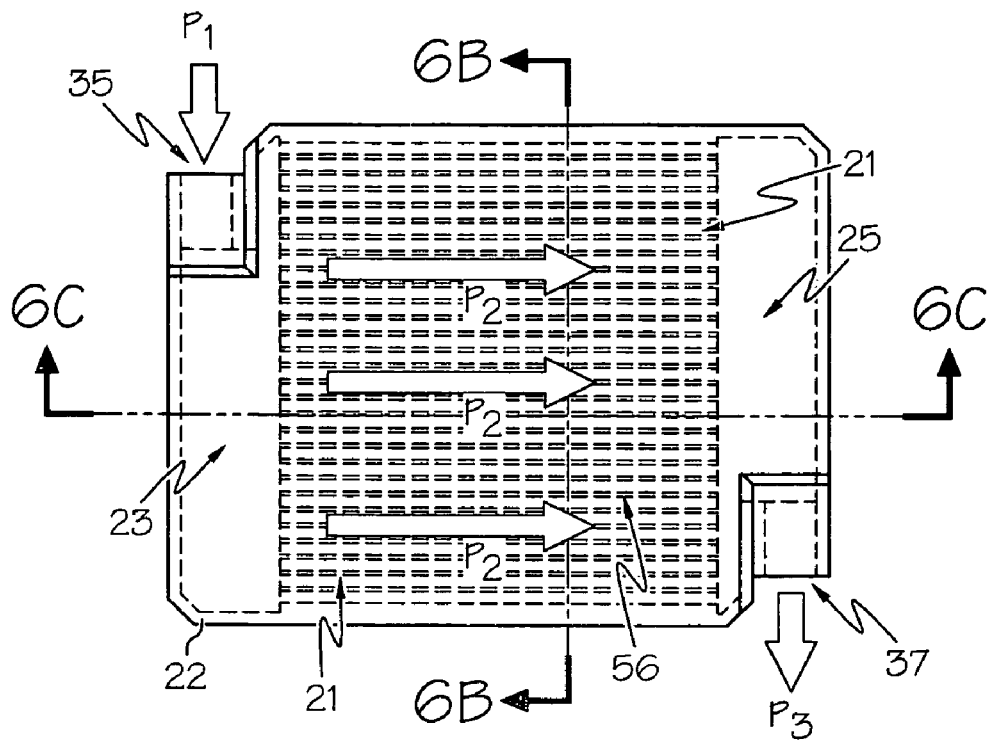
FIG. 6A is a top view of an example cooling device of the cooling apparatus of FIG. 1.
Figure 6B:
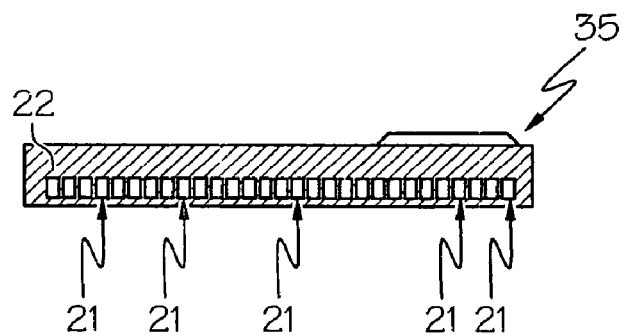
FIG. 6B is a sectional view of the example cooling device along line 6B-6B of FIG. 6A.
Figure 6C:
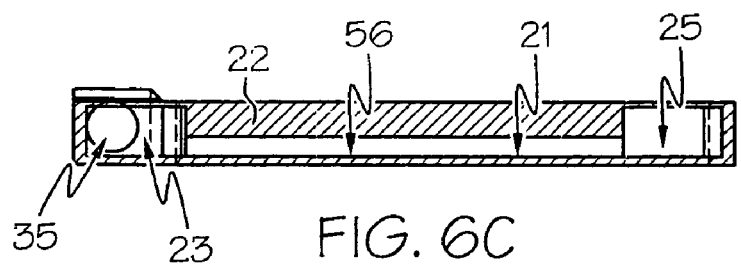
FIG. 6C is a sectional view of the example cooling device along line 6C-6C of FIG. 6A.

Various coolant fluid flow paths through the cooling devices 22, 60, 70 may be used with the present invention as required by various cooling device 22, 60, 70 and flexible conduit 38, 66, 76 configurations. As shown in FIG. 6A, the coolant fluid can enter the cooling device 22 along a first plane $P_1$, flow therethrough along a second plane $P_2$, and exit along a third plane $P_3$. As shown, the three planes can be substantially co-planar. For example, the coolant fluid enters the cooling device 22 at a first corner 35 (e.g., lower left) along a direction perpendicular to the direction of flow through the cooling unit 22. The coolant fluid flows into an intake manifold 23, flows through the various microchannels 21 and into an exhaust manifold 25. Subsequently, the coolant fluid exits the cooling device at an opposite corner 37 (e.g., upper right). It is to be appreciated that, because the flexible conduits 38 can have a helical geometry 40 adjustable along at least the vertical Y axis, the coolant can flow among various planes while within the flexible conduits 38. However, in the shown example, the first plane $P_1$ can be associated with the plane of the first corner 35, and the third plane $P_3$ can be associated with the opposite corner 37 of the cooling device 22.

As a first alternative example shown in FIG. 7A, the coolant fluid can enter the first alternate cooling device 60 at a first corner 62 (e.g., bottom left) along an angled, non-perpendicular direction to the direction of flow through the cooling unit 60, and exit along a similar angle at an opposite corner 64 (e.g., top right). As a second alternative example shown in FIG. 7B, the coolant fluid can enter the second alternate cooling device 70 at a first side 72 along a direction substantially the same as it exits on the opposite side 74. It is to be appreciated that various combinations of the coolant fluid flow paths through various cooling devices may also be used.

Operation of the cooling function of the cooling arrangement 10 will now be described. The source of coolant (e.g., a pump or the like, not shown) can cause the coolant fluid to enter the coolant plate 26 through the inlet port 32. The coolant fluid passes through the passage 28 in the coolant plate 26 to thereby absorb heat from the coolant plate 26 and the various electronic components 14 that it is thermally connected to (e.g., low heat load devices 18 and/or a mezzanine circuit board 30). Simultaneously, the coolant fluid can pass through the flexible conduits 38 to the cooling devices 22. As shown in FIG. 3, the cool coolant fluid enters the cooling device 22 through the inlet conduit 39 and flows through the cooling device 22 to thereby absorb heat from the associated IC 16. The warm coolant fluid exits the cooling device 22 through the outlet conduit 41 and flows back to the coolant plate 26 through the flexible conduit 38. The warm coolant fluid then exits the coolant plate 26 through the outlet port 34 and is transferred to an associated heat exchanger, as previously described herein. The heat exchanger can remove the heat from the coolant fluid and return it to the inlet port 32 of the coolant plate 26. As described herein, the arrangement has been described as a closed-loop system having a fixed amount of recycled coolant fluid. However, the arrangement 10 can include an open-loop system.

Figure 5:
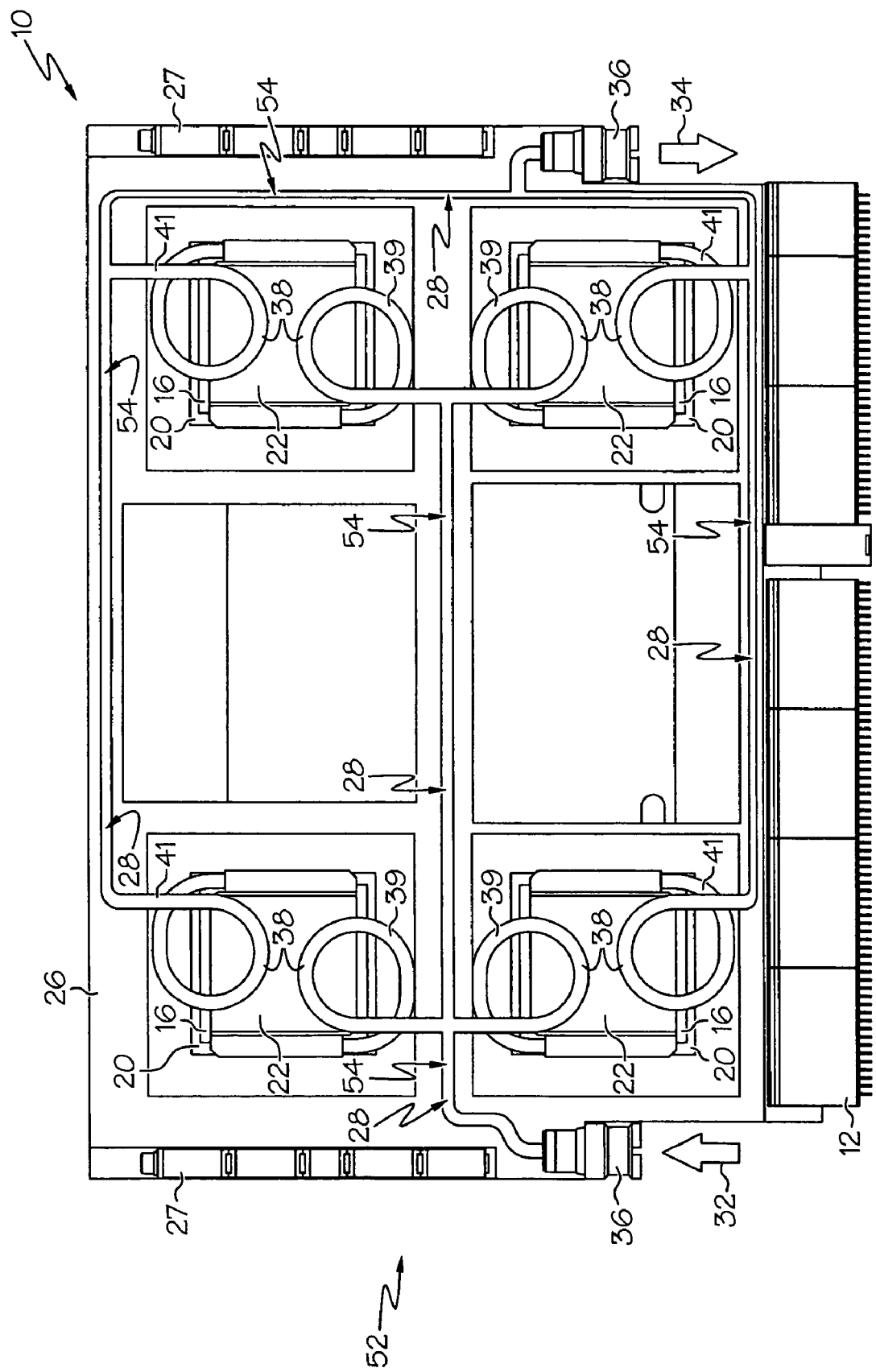
FIG. 5 is a sectional view along line 5-5 of FIG. 4 of an example fluid passage formed in an example coolant plate.

In accordance with another aspect of the invention, as shown in FIG. 5, the cooling arrangement 10 can include a cooling apparatus 52 that can further include a cooling pathway including a first passage 54 formed in the coolant plate 26 and a second passage 56 formed in the cooling device 22. The first passage 54 can include at least the passage 28 formed in the coolant plate 26, while the second passage 56 can include the microchannels 21 formed in the cooling device 22. The cooling pathway can further include the flexible conduits 38 to thereby provide fluid communication between the first passage 54 and the second passage 56 to transfer a portion of the coolant fluid therebetween. Thus, the heat absorbed by the cooling device 22 from an IC 16 is caused to be transferred away from the IC 16 along the cooling pathway, to the coolant plate 26, and ultimately to a heat exchanger (not shown). Further, a portion of the coolant fluid can be transferred within the first passage 54 to cause heat absorbed by the coolant plate 26 from other electronic components 14 (e.g., low heat load devices 18 and/or a mezzanine circuit board 30) to be transferred along the cooling pathway and ultimately to the heat exchanger (not shown) for removal of the heat from the coolant fluid. It is to be appreciated that the coolant plate 26 can comprise a manifold that supplies one or more of the cooling devices 22. For example, as shown, the first passage 54, including the various passages 28, can be arranged to supply/receive coolant fluid to/from some or all of the various cooling devices 22 in a parallel manner. However, some or all of the various cooling devices 22 can also be connected to the first passage 54 in a serial manner.

The cooling arrangement 10 can further include a plurality of cooling devices 22 wherein each cooling device 22 is thermally connected to a separate IC 16. Thus, the cooling arrangement 10 can include a plurality of cooling pathways, wherein each pathway is associated with a separate cooling device 22. Each cooling pathway includes the first passage 54 formed in the coolant plate 26. However, each cooling pathway can also include a separate second passage 56 formed in a separate one of the cooling devices 22, wherein the first passage 56 is independently in fluid communication (e.g., through separate flexible conduits 38) with each respective second passage 56. Thus, the heat absorbed by each respective cooling device 22 from each respective IC 16 is caused to be transferred away from that IC 16 by a portion of the coolant fluid. Thereafter, the heat-laden coolant fluid can flow along the respective cooling pathway (e.g., from the respective second passage 56 to the first passage 56), and ultimately to a heat exchanger (not shown) for removal of the heat from the coolant fluid.

As described herein, the use of a liquid flow through plate with cooling devices having selectively adjustable heights and/or forces can allow for relatively high heat loads to be dissipated. The use of microchannel cooling devices can allow for even greater heat loads to be dissipated. For example, each cooling device can dissipate approximately 120-150 Watts. Comparatively, a monolithic liquid flow through plate known in the prior art may only be able to dissipate approximately 40-50 Watts. Further, the ability to dissipate heat can increase with each additional cooling device. For example, if four cooling devices are used, approximately 480-600 Watts can be dissipated. It is to be appreciated that the cooling capabilities are not intended to provide a limitation on the present invention, and are provided herein as examples only.

It is to be appreciated that the present invention is not limited to a coolant fluid that remains in a single phase (e.g., liquid). Other examples of heat removal methods can include flow boiling through parallel channels, impingement flow normal to the plate of the electronic devices, liquid jet impingement, and/or spray evaporation. Additional, associated components can be added to the arrangement 10 to enable any of these cooling methods. For example, if spray evaporation were used, the cooling device 22 could include a nozzle adapted to spray the coolant fluid.

It is also to be appreciated that all of the materials and joining methods described herein should be chosen such that the deleterious effects of harsh environments (e.g., high and low temperatures, temperature shock, mechanical shock, vibration, humidity, and/or salt-laden air) are minimized. For example, choosing materials that are electrochemically similar or applying appropriate finishes or platings can minimize galvanic corrosion.

The invention has been described with reference to the preferred embodiments. Obviously, modifications and alterations will occur to others upon a reading and understanding of this specification. It is intended to include all such modifications and alterations insofar as they come within the scope of the appended claims or the equivalents thereof.

What is claimed is:

1. An arrangement having a cooling function, comprising:
a circuit board;
a plurality of heat generating electronic devices attached to the circuit board;
a plurality of cooling devices each thermally connected to at least one of the plurality of electronic devices, and each including an intake;
a coolant plate comprising a manifold configured in a parallel configuration providing independent fluid communication with the intake of each of the plurality of cooling devices; and
a source of pressurized coolant fluid connected to the coolant plate and adapted to cause the coolant fluid to be transferred between the coolant plate and each of the plurality of cooling devices independently via the parallel configuration such that separate portions of the coolant fluid are delivered to each of the plurality of cooling devices, each of the plurality of cooling devices being adapted to absorb heat from at least one of the plurality of electronic devices and transfer that heat to the coolant fluid, and the coolant plate being adapted to absorb heat from others of the plurality of electronic devices and transfer that heat to the coolant fluid.

2. The arrangement of claim 1, further comprising an adjustment device adapted to selectively adjust the height of a selected one of the plurality of cooling devices relative to an associated one of the plurality of electronic devices.

3. The arrangement of claim 2, wherein the adjustment device is further adapted to selectively adjust a force applied by the selected one of the plurality of cooling devices onto the associated one of the plurality of electronic devices.

4. The arrangement of claim 1, further comprising a plurality of flexible conduits attached to the plurality of cooling devices and the coolant plate, the flexible conduits being adapted to permit a coolant fluid to be transferred between the plurality of cooling devices and the coolant plate.

5. The arrangement of claim 1, wherein at least one of the plurality of cooling devices comprises a microchannel cooling device.

6. The arrangement of claim 1, further comprising a thermal interface material disposed between at least one of the plurality of cooling devices and an associated one of the plurality of electronic devices.

7. The arrangement of claim 1, further comprising a cooling pathway including a first passage formed in the coolant plate defining a portion of the manifold and a second passage formed in each of the plurality of cooling devices, the first passage being in fluid communication with the second passage of each of the plurality of cooling devices to transfer separate portions of the coolant fluid between the coolant plate and each of the plurality of cooling devices.

8. The arrangement of claim 1, wherein each of the plurality of cooling devices is thermally connected to a separate one of the plurality of electronic devices.

9. The arrangement of claim 1, further comprising a plurality of circuit boards thermally connected to the coolant plate, the coolant plate being adapted to absorb heat from each of the plurality of circuit boards and transfer that heat to the coolant fluid.

10. The arrangement of claim 1, wherein the plurality of cooling devices each include an exhaust, and wherein the coolant fluid can enter each of the plurality of cooling devices via the intake thereof along a first plane, flow through each of the cooling devices along a second plane, and exit each of the cooling devices via the exhaust thereof along a third plane, the three planes of each one of the plurality of cooling devices being substantially co-planar.

11. An arrangement having a cooling function, comprising:
a circuit board;
a plurality of heat generating electronic devices attached to the circuit board;
a cooling device thermally connected to one of the plurality of electronic devices and including an intake and an exhaust;
a coolant plate;
a plurality of flexible conduits attached to the cooling device and the coolant plate, the flexible conduits being adapted to permit a coolant fluid to be transferred between the cooling device and the coolant plate, wherein the coolant fluid can enter the cooling device via the intake along a first plane, flow through the cooling device along a second plane, and exit the cooling device via the exhaust along a third plane, the three planes being substantially co-planar; and
an adjustment device adapted to selectively adjust the height of the cooling device relative to the one of the plurality of electronic devices.

12. The arrangement of claim 11, wherein the adjustment device is further adapted to selectively adjust a force applied by the cooling device onto the one of the plurality of electronic devices.

13. The arrangement of claim 11, wherein the cooling device is adapted to absorb heat from the one of the plurality of electronic devices and transfer that heat to the coolant fluid, the coolant plate being adapted to absorb heat from the remainder of the plurality of electronic devices and transfer that heat to the coolant fluid.

14. The arrangement of claim 11, further comprising a plurality of cooling devices, each cooling device being thermally connected to a separate one of the plurality of electronic devices.

15. The arrangement of claim 14, further comprising a plurality of adjustment devices, each of the plurality of adjustment devices being adapted to selectively adjust the height of one of the respective cooling devices relative to the one of the plurality of electronic devices that the respective cooling devices are thermally connected to, and wherein the plurality of adjustment devices are further adapted to selectively adjust a force applied by one of the respective cooling devices onto the respective electronic device that the cooling device is thermally connected to.

16. The arrangement of claim 14, wherein the coolant plate comprises a manifold configured in a parallel configuration providing independent fluid communication with the intake of each of the plurality of cooling devices, such that separate portions of the coolant fluid are delivered to each of the plurality of cooling devices via the parallel configuration.

17. A cooling apparatus within a cooling arrangement having a circuit board, a plurality of heat generating electronic devices attached to the circuit board, and a source of pressurized coolant, the cooling apparatus comprising:
a plurality of cooling devices each thermally connected to at least one of the plurality of electronic devices, and each including an intake;
a coolant plate comprising a manifold configured in a parallel configuration providing independent fluid communication with the intake of each of the plurality of cooling devices, the manifold comprising a first passage; and
a plurality of cooling pathways each including the first passage formed in the coolant plate and a second passage formed in one of the plurality of cooling devices, the first passage being in fluid communication with the second passage of each of the plurality of cooling devices independently via the parallel configuration such that separate portions of the coolant fluid are transferred between the coolant plate and each of the plurality of cooling devices to cause heat absorbed by the cooling device from an associated one of the plurality of electronic devices to be transferred therefrom, and another portion of the coolant fluid being transferred within the first passage to cause heat absorbed by the coolant plate from others of the plurality of electronic devices to be transferred therefrom.

18. The arrangement of claim 17, wherein the coolant plate further comprises a second manifold configured in a parallel configuration providing independent fluid communication with the exhaust of each of the plurality of cooling devices.

19. The arrangement of claim 17, wherein the coolant fluid can enter each of the plurality of cooling devices via the intake thereof along a first plane, flow through each of the cooling devices along a second plane, and exit each of the cooling devices via the exhaust thereof along a third plane, the three planes of each one of the plurality of cooling devices being substantially co-planar.

20. The arrangement of claim 17, further comprising a plurality of adjustment devices, each of the plurality of adjustment devices being adapted to selectively adjust the height of one of the respective cooling devices relative to the one of the plurality of electronic devices that the respective cooling devices are thermally connected to, and wherein the plurality of adjustment devices are further adapted to selectively adjust a force applied by one of the respective cooling devices onto the respective electronic device that the cooling device is thermally connected to.

* * * * *

UNITED STATES PATENT AND TRADEMARK OFFICE
CERTIFICATE OF CORRECTION

PATENT NO.       : 7,515,418 B2
APPLICATION NO.  : 11/527794
DATED            : April 7, 2009
INVENTOR(S)      : Ivan Straznicky et al.

It is certified that error appears in the above-identified patent and that said Letters Patent is hereby corrected as shown below:

Column 4, line 44, please delete "toga" and insert --to a--.

Signed and Sealed this
Eighth Day of February, 2011

David J. Kappos
*Director of the United States Patent and Trademark Office*